United States Patent [19]

Ushida

[11] Patent Number: 4,580,290
[45] Date of Patent: Apr. 1, 1986

[54] AMPLIFIER FOR USE WITH LOCAL OSCILLATORS

[75] Inventor: Susumu Ushida, Soma, Japan
[73] Assignee: Alps Electric Co., Ltd., Tokyo, Japan
[21] Appl. No.: 495,781
[22] Filed: May 18, 1983
[30] Foreign Application Priority Data
  May 19, 1982 [JP] Japan .............................. 57-73367[U]
[51] Int. Cl.[4] ............................................. H04B 1/26
[52] U.S. Cl. .................................... 455/319; 455/307; 455/311
[58] Field of Search ............... 455/318, 319, 310, 325, 455/327, 307, 311, 314–317

[56] References Cited
U.S. PATENT DOCUMENTS

| | | | |
|---|---|---|---|
| 2,228,815 | 1/1941 | Deerhake | 455/314 |
| 4,340,975 | 7/1982 | Onishi et al. | 455/327 |
| 4,375,699 | 3/1983 | Hallford | 455/327 |
| 4,406,020 | 9/1983 | Reindel | 455/327 |

Primary Examiner—Marc E. Bookbinder
Attorney, Agent, or Firm—Guy W. Shoup

[57] ABSTRACT

An amplifier for use with a local oscillator in a frequency converter including a mixer for converting a number of channel frequencies received into a certain band of intermediate frequencies, comprises a circuit for amplifying an oscillation signal from the local oscillator and supplying an amplified signal to the mixer through an output terminal thereof, and a trap circuit composed of distributed constant elements for suppressing the certain range of intermediate frequencies. The distributed constant elements include a first microstrip line connected in series to the output terminal, a second microstrip line connected in series with the first microstrip line, and a third microstrip line connected in parallel to the second microstrip line. The second microstrip line serves as an open stub, and the third microstrip line as a short stub.

3 Claims, 7 Drawing Figures

AMPLIFIER FOR USE WITH LOCAL OSCILLATORS

BACKGROUND OF THE INVENTION

The present invention relates to an amplifier for use with a local oscillator, and more particularly to such an amplifier for amplifying an oscillated output from a local oscillator circuit which is to be applied to a mixer circuit in a frequency converter.

Conventional amplifiers for use with local oscillators in frequency converters such as CATV (community antenna television) converters have a large amplification level at an intermediate frequency band, and hence suffer from increased noise components in proportion with the amplification level and make the NF (noise figure) of the converter quite poor. Since the amplification level and hence the harmonic level are greater on reception of lower frequencies than on reception of higher frequencies, the disturbing beat is increased and appears at the input terminal of the amplifier when lower frequencies are received.

SUMMARY OF THE INVENTION

It is an object of the present invention to provide an amplifier for use with local oscillators in frequency converters which is capable of reducing distortion caused in the mixer circuit and has a good noise figure.

According to the present invention, an amplifier for use with a local oscillator in a frequency converter including a mixer for converting a number of channel frequencies received into a certain band of intermediate frequencies, comprises a circuit for amplifying an oscillation signal from the local oscillator and supplying an amplified signal to the mixer through an output terminal thereof, and a trap circuit composed of distributed constant elements for suppressing said certain range of intermediate frequencies.

The above and other objects, features and advantages of the present invention will become more apparent from the following description when taken in conjunction with the accompanying drawings in which a preferred embodiment of the present invention is shown by way of illustrative example.

DETAILED DESCRIPTION

Frequency converters for use as home terminals in a CATV (community antenna television) system are operated to select one out of a number of CATV channels of substantially the same level which are transmitted to homes through a coaxial cable.

Figure 1:
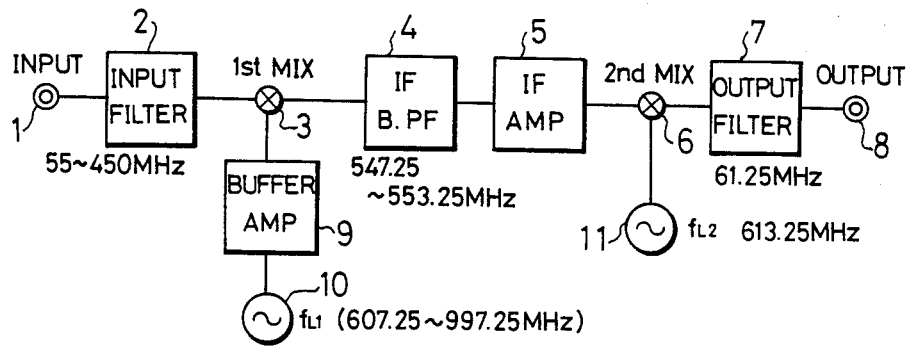
FIG. 1 is a block diagram of a general CATV (community antenna television) converter.

FIG. 1 shows in block form such a converter in general use. The converter has an input terminal 1, an input band filter 2, a first mixer 3, an intermediate frequency filter 4, an intermediate frequency amplifier 5, a second mixer 6, an output band filter 7, an output terminal 8, an amplifier 9 for use with a local oscillator, a first local oscillator 10, and a second local oscillator 11.

The input terminal 1 receives frequencies in a number of CATV channels transmitted through a coaxial cable. The received channel frequencies are converted into intermediate frequencies by the first mixer 3 which is supplied with an oscillated output from the first local oscillator 10 as amplified by the amplifier 9. The intermediate frequency filter 4 then selects only the frequency band in a desired channel out of the intermediate frequencies. The desired channel frequency can be picked out of the input channel frequencies by changing the oscillation frequency $f_{L1}$ from the first local oscillator 10. The selected intermediate frequency is amplified by the intermediate frequency amplifier 5, and the amplified intermediate frequency is converted into another frequency by the second mixer 6 which is operated by the output from the second local oscillator 11. The converted frequency is then fed through the output band filter 7 and the output terminal 8 to a television receiver (not shown).

The first mixer 3 is generally of the double-balanced type composed of four diodes in order to suppress distortion caused at the time of frequency conversion in the channels received at substantially the same level. With the four diodes, the double-balanced mixer requires a relatively large input which necessitates the amplifier 9 as shown in FIG. 1.

The first mixer 3 is supplied with a local oscillation frequency Fos that is selected to produce an intermediate frequency Fif from a channel frequency Fin to be picked out. Thus, the first mixer 3 generates an output Fif=Fos−Fin.

The frequencies in the frequency converter are as follows: The input frequency Fin ranges from about 55 to 450 MHz, the first local frequency Fos ranges from about 607 to 997 MHz, and the intermediate frequency Fif is about 552 MHz. The frequency band for the amplifier 9 for the local oscillator 10 is substantially the same as the frequency range for the first local oscillator 10. The amplifier actually has a substantial degree of amplification outside the above frequency range. For example, the amplifier 9 has a certain amplification degree at 553 MHz (in the vicinity of the intermediate frequency) and produces an output containing noise components. Once such noise components enter the first mixer 3, the NF of the frequency converter becomes poor.

The amplifier 9 is a wide-band amplifier with the amplification degree increasing as the frequency becomes lower. As a result, higher harmonics become greater as the frequency is lowered. Many higher harmonics exist in the range of from about 1,000 to 1,200 MHz, which is twice the lower band.

As described above, the frequency converter of this type is fed with many channel frequencies (55 through 450 MHz). When the channel 2 (55 MHz), for instance, is received, the frequency converter controls the first local oscillator 10 to produce an oscillation frequency of about 607 MHz. The input frequency 55 MHz is then converted into the frequency 552 MHz. The highest input frequency 450 MHz is converted into the frequency 157 MHz. Therefore, the converted frequency ranged from 157 to 552 MHz. This is a form of conversion of a block of frequencies. Out of these converted frequencies, the frequencies between 157 MHz and 450 MHz are transmitted back to other cables via the input terminal. This phenomenon can be avoided by selecting a higher intermediate frequency. However, the intermediate frequency cannot be rendered higher for some other reasons.

Figure 2:
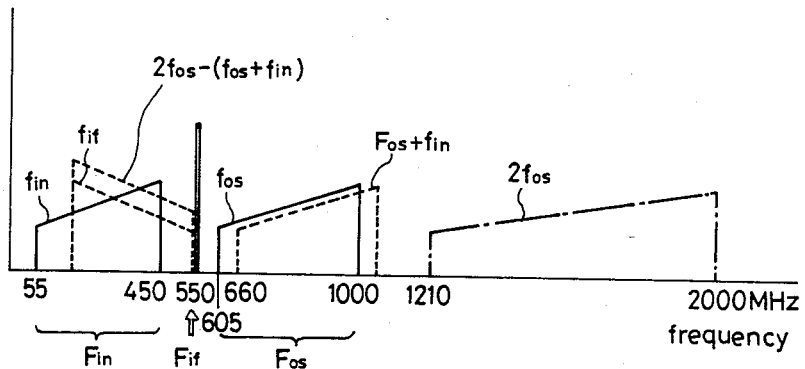
FIG. 2 is a diagram showing a frequency spectrum explanatory of a reflection toward an input end.

FIG. 2 is a frequency spectrum diagram illustrative of a reflection toward the input terminal. As shown in FIG. 2, the input frequency Fin ranges from 55 MHz to 450 MHz. When 55 MHz is selected out of these input frequencies Fin, the local frequency Fos is selected to be 605 MHz as the intermediate frequency Fif is 550 MHz. The input frequency band ranging from 55 to 450 MHz is converted by the first mixer 3 into the frequency band in the range of from 550 to 150 MHz. Those in the range of from 55 to 450 MHz, out of these frequencies, are reflected toward the input terminal and transmitted through cables into other devices. It is necessary that these reflected components be suppressed as much as possible. Where there are harmonics twice the local frequencies, the converted frequency components reflected to the input terminal are increased as illustrated. The converted frequency can be given by:

Fif = Fos − Fin and also can be expressed by:

Fif = 2Fos − (Fos + Fin)

Accordingly, the level of the frequencies to be converted becomes higher as the harmonics twice the local frequencies are increased.

Figure 3:
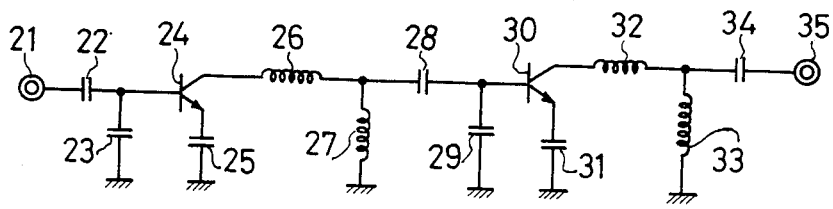
FIG. 3 is a circuit diagram of an equivalent circuit of a conventional amplifier for local oscillators which is shown as designed with only high frequencies taken into consideration.
Figure 4:
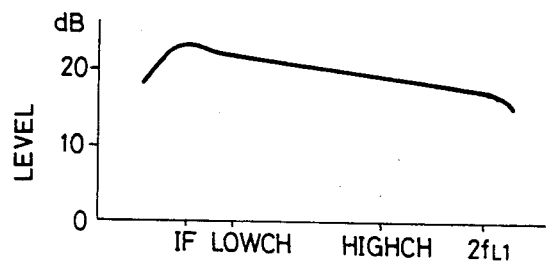
FIG. 4 is a graph showing the output characteristics of the amplifier illustrated in FIG. 3.

FIG. 3 shows an equivalent circuit of a conventional amplifier for use with local oscillators which is shown as being designed with only higher frequencies considered, and FIG. 4 is illustrative of the output characteristics of the amplifier of FIG. 3. The amplifier includes an input terminal 21, capacitors 22, 23, a transistor 34, a pass capacitor 25, coils 26, 27, capacitors 28, 29, a transistor 30, a pass capacitor 31, coils 32, 33, a capacitor 34, and an output terminal 35.

The prior amplifier as shown in FIG. 3 has the output characteristics as illustrated in FIG. 4, which suffer from the following problems: Since the amplification level of the amplifier is larger in the intermediate frequency range, the noise components are greater in proportion therewith, resulting in a much poorer NF of the converter. Since the amplification level is higher on reception of a lower channel LOWCH than on reception of higher frequencies, and hence the harmonics level is greater, the disturbing beat that is expressed by the following equation is increased at the time of receiving the LOWCH and appears on the input terminal 21:

Disturbing beat = 2fos − (fos + fin)

where fos is the local frequency and fin the input frequency.

According to the present invention, the amplifier includes a trap for preventing the converter NF from becoming poorer, suppressing harmonics twice the local frequency, and reducing the converted frequencies transmitted back to the input terminal. If a trap circuit were inserted in the prior circuit of FIG. 3, no two traps or suppressed frequency signals would be formed simultaneously because of lumped constants. For simultaneous formation of such two traps, two trap circuits would be necessary and adjustment would be required at two or more locations. As a result, interference would be caused between two traps and adjustment would be diffcut to achieve.

The present invention will now be described with reference to FIGS. 5 through 7.

Figure 5:
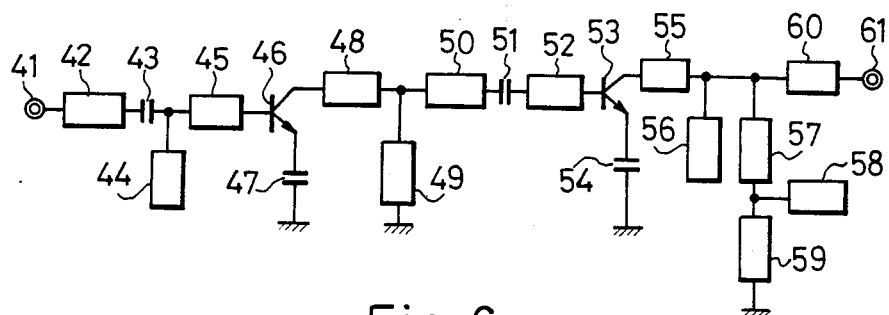
FIG. 5 is a block diagram of an amplifier for use with a local oscillator according to the present invention.

FIG. 5 shows an equivalent circuit of an amplifier for use with a local oscillator according to the present invention. The amplifier comprises an input terminal 41, a microstrip line 42, a pass capacitor 43, an open stub 44, a microstrip line 45, a transistor 46, a pass capacitor 47, a microstrip line 48, a short stub 49, a microstrip line 50, a capacitor 51, a microstrip line 52, a transistor 53, a pass capacitor 54, a microstrip line 55, an open stub 56, a microstrip line 57, a microstrip line 58 serving as an open stub, a microstrip line 59 serving as a shorted stub, a microstrip line 60, and an output terminal 61.

According to the arrangement of FIG. 5, the microstrip line 57 is connected in series between the output terminal 61 and the parallel-connected circuit composed of the microstrip line 58 serving as an open stub which is slightly shorter than ¼ of the wavelength λ of the intermediate frequency and the microstrip line 59 serving as a short stub. The microstrip lines 58, 59, one capacitive and the other inductive, jointly form a parallel resonant circuit, which cooperates with the microstrip line 57 that is inductive in forming a series resonant circuit.

With frequencies about twice the intermediate frequency, the microstrip lines 58, 59 are rendered inductive and capacitive, respectively, which likewise form a series resonant circuit and constitute a trap circuit. The circuit composed of the microstrip lines 57, 58, 59 is thus added to the amplifier for use with a local oscillator in a frequency converter. By selecting constants such that the series resonance takes place at the intermediate frequency, a trap can be formed in the vicinity of the frequency which is twice the intermediate frequency as well as at the intermediate frequency itself.

Figure 6:
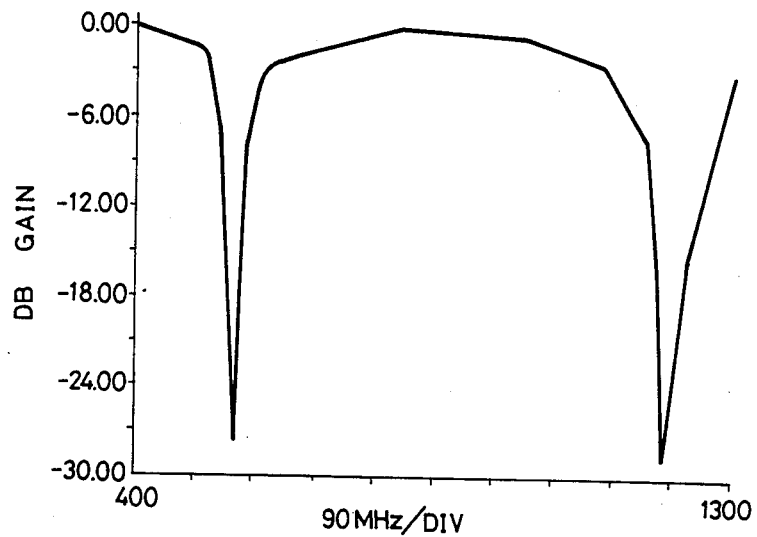
FIG. 6 is a graph showing the characteristics of a trap circuit according to the present invention.
Figure 7:
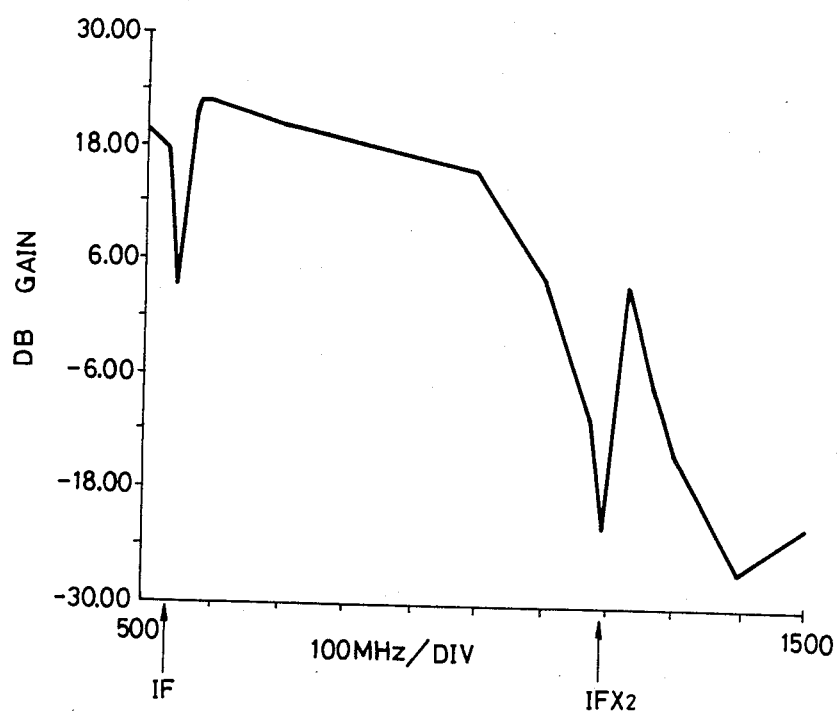
FIG. 7 is a graph illustrative of the output characteristics of the amplifier of the present invention.

FIG. 6 shows the characteristics of the trap circuit of the present invention, and FIG. 7 is illustrative of the output characteristics of an amplifier for use with local oscillators which includes such a trap circuit in its output circuit.

The trap circuit thus composed of the microstrip lines 57, 58, 59 has the trapping characteristics shown in FIG. 6. With the trap circuit coupled to the output terminal of the amplifier, the output characteristics of the wide band amplifier are as illustrated in FIG. 7 in which the frequency signals are suppressed at the intermediate frequency and the frequency which is twice as high as the intermediate frequency.

Since the level of the local second harmonic is generally such that $2f_{L1} > > 2f_{L2}$ where $f_{L1}$ is the first local frequency and $f_{L2}$ is the second local frequency, the NF and disturbing beat can be improved to a higher extent by inserting traps at the intermediate frequency and the frequency $2f_{L1}$.

With the arrangement of the present invention, the trapping or signal suppressing effect becomes available at two points with a single trap circuit, requiring a circuit arrangement which would otherwise be doubled. If two trap circuits with lumped constants were connected to the output terminal, they would interfere with each other and be difficult to adjust. According to the invention, however, adjustment only needs to be made at one point, either the intermediate frequency or the frequency $2f_{L1}$, resulting in the capability in improving the NF and disturbing beat at the same time. The amplifier of the present invention is particularly advantageous when used with a frequency converter such as a CATV converter in which the frequency about twice as high as the intermediate frequency is close to that twice the lowest oscillation frequency of the first local oscillator.

Although a certain preferred embodiment has been shown and described, it should be understood that many changes and modifications may be made therein without departing from the scope of the appended claims.

What is claimed is:

1. A frequency converter comprising a local oscillator, mixer means for converting a number of channel frequencies received into a certain band of intermediate frequencies, and an amplifier circuit coupled between said local oscillator and mixer means for amplifying an oscillation signal from said local oscillator to supply an amplified local oscillation signal at an output terminal thereof to said mixer means, said amplifier circuit including a trap circuit coupled to the output terminal and composed of distributed constant elements for suppressing an undesirable intermediate frequency by said elements having one resonant trap characteristic and for suppressing an undesirable frequency twice said intermediate frequency by said elements having another resonant trap characteristic.

2. An amplifier acording to claim 1, wherein said distributed constant elements include a first microstrip line coupled at one end thereof to said output terminal, and a second and a third microstrip line connected to another end of said first microstrip line.

3. An amplifier according to claim 2, wherein said second microstrip line serves as an open stub, and said third microstrip line as a shorted stub.

* * * * *